(12) United States Patent
Clendenning et al.

(10) Patent No.: US 8,440,556 B2
(45) Date of Patent: May 14, 2013

(54) FORMING CONFORMAL METALLIC PLATINUM ZINC FILMS FOR SEMICONDUCTOR DEVICES

(75) Inventors: Scott Bruce Clendenning, Portland, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 12/975,786

(22) Filed: Dec. 22, 2010

(65) Prior Publication Data

US 2012/0161252 A1    Jun. 28, 2012

(51) Int. Cl.
 *H01L 21/20*    (2006.01)
(52) U.S. Cl.
 USPC ........... 438/584; 438/680; 438/686; 438/758; 257/E21.001; 257/E21.477; 257/E21.478

(58) Field of Classification Search .......... 438/584, 438/680, 681, 685, 758, 765; 257/E21.001, 257/E21.477, E21.478; 427/248.1, 250, 255.26, 427/255.28, 255.33
See application file for complete search history.

(56) References Cited

U.S. PATENT DOCUMENTS

2003/0111341 A1 * 6/2003 Wiedenmann et al. .. 204/290.01

\* cited by examiner

*Primary Examiner* — Hsien Ming Lee
(74) *Attorney, Agent, or Firm* — Blakely, Sokoloff, Taylor & Zafman LLP

(57) ABSTRACT

Forming conformal platinum-zinc films for semiconductor devices is described. In one example, a conformal film is formed by heating a substrate in a reaction chamber, exposing a desired region of the substrate to a precursor that contains platinum, purging excess precursor from the chamber, exposing the desired region of the substrate to a co-reactant containing zinc to cause a reaction between the precursor and the co-reactant to form a platinum zinc film on the desired region, and purging the chamber of excess reaction by-products.

17 Claims, 7 Drawing Sheets

Molecular structures of Pt(II) ALD precursors:

R, R' = alkyl

= Any cyclic or acyclic diolefin

Molecular structures of Zn(II) coreactants:

R, R' = alkyl, aryl

FORMING CONFORMAL METALLIC PLATINUM ZINC FILMS FOR SEMICONDUCTOR DEVICES

BACKGROUND OF THE INVENTION

1. Field of the Invention

The present invention relates to the field of semiconductor processing and more particularly to forming of metallic platinum zinc films by deposition on semiconductor devices.

2. Discussion of Related Art

Low resistance contact layers are commonly formed on gate, source, and drain regions of transistors and other microelectronic components to improve performance. An example of a low resistance contact layer is the self-aligned silicide layer, commonly referred to as salicide. Current metal deposition for salicide formation is accomplished by physical vapor deposition (PVD). However, the directional nature of the depositing flux in the PVD technique has drawbacks. These include the difficulty in depositing metal at the bottom of high aspect ratio features and the non-conformal metal deposition on three-dimensional (3D) features of 3D transistor structures. In addition, many deposited materials do not show a p-type work function in transistor and diode structures.

BRIEF DESCRIPTION OF THE DRAWINGS

The disclosed embodiments will be better understood from a reading of the following detailed description, taken in conjunction with the accompanying drawings in which.

DETAILED DESCRIPTION OF THE PRESENT INVENTION

Figure 1:
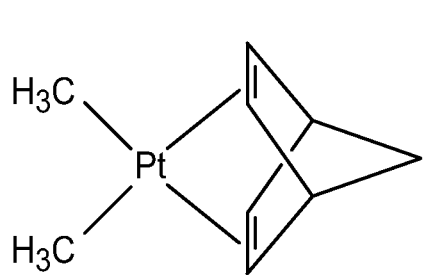
FIG. 1 is a diagram of representative chemical structures for a platinum precursor according to an embodiment of the invention.
Figure 1:
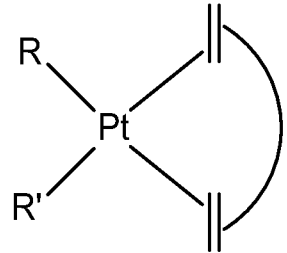
Figure 1:

Some embodiments of the present invention relate to an oxygen-free, low temperature, thermal atomic layer deposition (ALD) or pulsed chemical vapor deposition (CVD) process for the conformal deposition of a highly p-type PtZn material. This technique has been developed for PMOS (P-type Metal Oxide Semiconductor) contact and gate metal applications. However, it can be used for many other types of metal and protective films. Unlike pure Pt films, the ALD PtZn film has very good cleanability.

Atomic layer deposition (ALD) is a well defined conformal thin film deposition technique in which a heated substrate is alternatively exposed to pulses of a precursor and a co-reactant. The pulses are separated by chamber purges to remove volatile by-products. A final chamber purge removes excess precursor, co-reactant, and any reaction by products. The ALD process allows for a highly conformal and uniform, self-limited film growth. This provides excellent control of ultrathin (e.g. less than 300 Å) film deposition at relatively low temperatures (e.g. 25 C to 450 C). A pulsed chemical vapor deposition process (CVD) is executed in a similar fashion to an ALD process but growth is not self-limited, rather, it scales with the dose of the precursor or co-reactant.

In the present example, the precursor molecule may be a Pt(II) organometallic compound and the co-reactant may be a dialkylzinc compound. Using this precursor and co-reactant a platinum-zinc composition is deposited that has an empirical formula of approximately $Pt_{0.7}Zn_{0.3}$. The specific formula may be varied to suit different applications. The composition may be an alloy or a mixture depending upon the parameters of the deposition process.

The deposited ALD $Pt_{0.7}Zn_{0.3}$ film has a measured resistivity of 60 $\mu\Omega\cdot cm$ and can be deposited on a variety of substrates as described below. This resistivity is substantially less than many existing PVD films. The film can be efficiently removed using standard metal etch cleans, for example mixtures of sulfuric acid and hydrogen peroxide, thus allowing the integration of a cleanable highly p-type ALD metal for PMOS device applications, among others.

The ALD film, as described, provides a conformal, low temperature, oxygen-free thermal metal. The resulting metal is a cleanable, highly p-type, low resistivity metal that can be used in a silicide or non-silicide-based contact or gate stack, for example. It is particularly useful as a part of a three dimensional transistor design without the need for a vacuum break during processing. The ALD process, together with the described precursors and co-reactants offers inherently better thickness control and uniformity control across the substrate of a semiconductor wafer. In addition the resulting film conforms much better to the surfaces of angled and vertical features.

It is difficult to obtain low electrical resistivity metallic films via thermal ALD processes. While low resistance noble metals such as Pt can be deposited using ALD with oxygen-containing co-reactants, these processes tend to oxidize the underlying substrate leading to undesirable interfacial properties. The ALD PtZn material, however, can be deposited in an oxygen-free process and has a very low resistivity which may be similar to other pure metal silicides and is lower than most oxygen-free ALD metals. These features when applied to ultra-thin and conformal films obtainable with ALD enable new structures to be created with a low total series resistance.

A reaction of a Pt(II) precursor and an organozinc co-reactant during an ALD process leads to the formation of an electrically conductive platinum zinc alloy which could find application as a conformal contact or gate metal. The PtZn layer can be used for contact applications, contact metallizations, or a metal gate of a semiconductor device, among others. In particular, the film or layer can be conformally deposited onto 3D transistor structures or into high aspect ratio contact holes.

The PtZn layer can be formed using a variety of different precursors that contain platinum. Examples of such compounds include Pt(II) compounds including, but not limited to dialkyl (bis alkene) platinum (II) compounds. FIG. 1 shows examples of representative chemical structures.

Figure 2:
FIG. 2 is a diagram of representative chemical structures for a zinc co-reactant according to an embodiment of the invention.

The co-reactant can be any of a variety of different zinc compounds including organozinc compounds including, but not limited to, a dialkylzinc, diarylzinc or a mixed alkylarylzinc compound. FIG. 2 shows examples of representative chemical structures.

Different substrate materials can be used such as H-terminated silicon, silicon dioxide/silicon, silicon germanium, germanium, a compound semiconductor (for example, III-V), a main-group oxide, a metal, or a binary or mixed metal oxide. The substrate may or may not be implanted with otherelements such as germanium, arsenic or phosphorus. The substrate may or may not be activated prior to ALD deposition by exposure to organic or inorganic ALD nucleation promoting substance(s).

Figure 3:
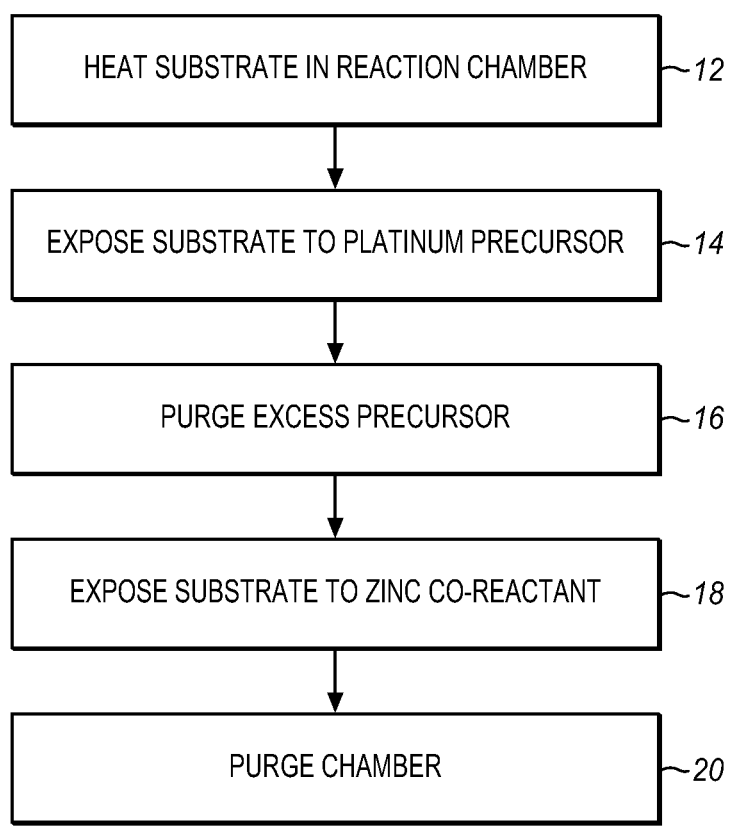
FIG. 3 is a process flow diagram for forming a conformal platinum-zinc layer according to an embodiment of the invention.

Referring to FIG. 3, a process for forming an ALD $Pt_{0.7}Zn_{0.3}$ deposition layer is described. In one example, this layer can be formed using dimethyl (1,5-cyclooctadiene) platinum (II) with diethylzinc (DEZ) or dimethylzinc (DMZ) co-reactants on both H-terminated and chemox silicon substrates. Starting at block 12, the substrate is held at between 90 and 150 C. At block 14, the precursor is introduced into the chamber. The platinum precursor may be held at 70-85 C in order to assure significant vapor pressure. Substrate temperatures higher than 150 C may alternatively be used. These initially lead to chemical vapor deposition (CVD) of the organozinc coreactant and an increased Zn content in the film An ALD cycle may use an initial 1-10 s discharge 14 of a Pt(II) precursor source, a 1-10 s purge 16 of the chamber, a 0.1-10 s discharge 18 of DEZ or DMZ, and a final 1-10 s chamber purge 20. The ALD process may be repeated with successive cycles of discharge and purge until the desired film thickness is obtained.

A conductive film produced in this way can have film resistivities measured at 60 $\mu\Omega \cdot cm$. This is significantly less resistive than many other ALD metal films. The atomic percent composition can be approximately 68-69 at % Pt, 29-30 at % Zn and 2-3 at % C. There appear to be one or two coexisting unreported crystallographic PtZn phases in the layer.

The PtZn film also can be easily removed, unlike typical Pt films. A standard room temperature metal etch such as one using a mixture of sulfuric acid and hydrogen peroxide may be used to virtually completely remove the PtZn film, depending on the process parameters. The PtZn film may be essentially removed completely or some portion of the film may be left, depending on the desired final structure. A similar metal etch clean even at an elevated temperature is not able to remove a pure Pt ALD film. Even after annealing the film on a silicided area, an unreacted ALD PtZn film can be removed with a standard metal etch clean, leaving behind a layer of conductive surface silicide.

An example of a method of forming a platinum zinc layer on a semiconductor device to build, for example a FinFET (Fin Field Effect Transistor) transistor, is illustrated in FIGS. 4A-4F in accordance with one embodiment of the present invention. Similar techniques may be used to build a wide range of different components. The semiconductor device comprises a substrate 40 having a semiconductor body 30 formed thereon. In the case of the FinFET transistor, the semiconductor body 30 can either be the source or drain region of the FinFET transistor.

The substrate 40 is made of a semiconductor material such as but not limited to silicon (Si), silicon germanium (SiGe), germanium (Ge), and III-V compound semiconductors. The substrate 40 can be a single crystal or polycrystalline. It can be a semiconductor heterostructure such as but not limited to a silicon-on-insulator (SOI) substrate, or a multi-layered substrate comprising silicon, silicon germanium, germanium, III-V compound semiconductors, and any combinations thereof. Furthermore, the multi-layered substrate can also include insulator-semiconductor stacks, such as but not limited to silicon dioxide on silicon, or metal-oxide on silicon.

The semiconductor body 30 is a fin-shaped or ridge-shape structure comprising a top surface 71, a first sidewall 72 and a second sidewall 73. The first sidewall 72 and the second sidewall 73 extend from opposite sides of the top surface 71 to the top surface 41 of substrate 40. It can be made of any of the sorts of materials mentioned above for the substrate and may be made of the same or a different material as the substrate. The body can be is patterned or etched from the substrate to form the semiconductor body 30.

Figure 4A:
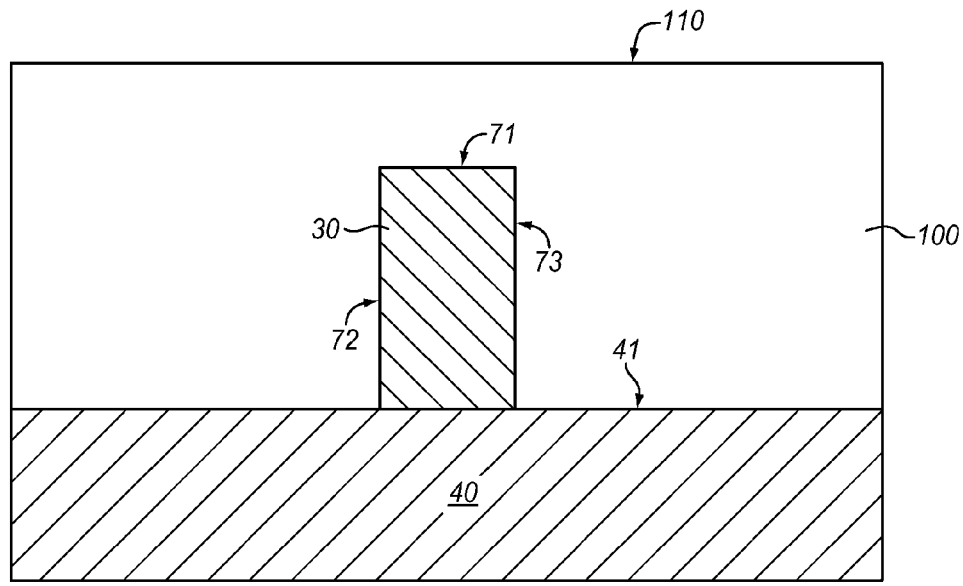
FIGS. 4A to 4F are cross-sectional views of forming a conformal platinum-zinc layer on a semiconductor device according to an embodiment of the invention.

Next, an interlayer dielectric (ILD) 100 is deposited on the semiconductor body 30 and substrate 40 as shown in FIG. 4A. The interlayer dielectric 100 includes a top surface 110 formed above the top surface 71 of the semiconductor body 30. The ILD 100 is made of any suitable and well known dielectric material, such as but not limited to silicon dioxide (SiO2) and may be made from a low-k material (k<3.6), such as but not limited to carbon doped oxide. The ILD can be deposited by well known techniques such as but not limited to chemical vapor deposition (CVD) and physical vapor deposition (PVD).

Figure 4B:
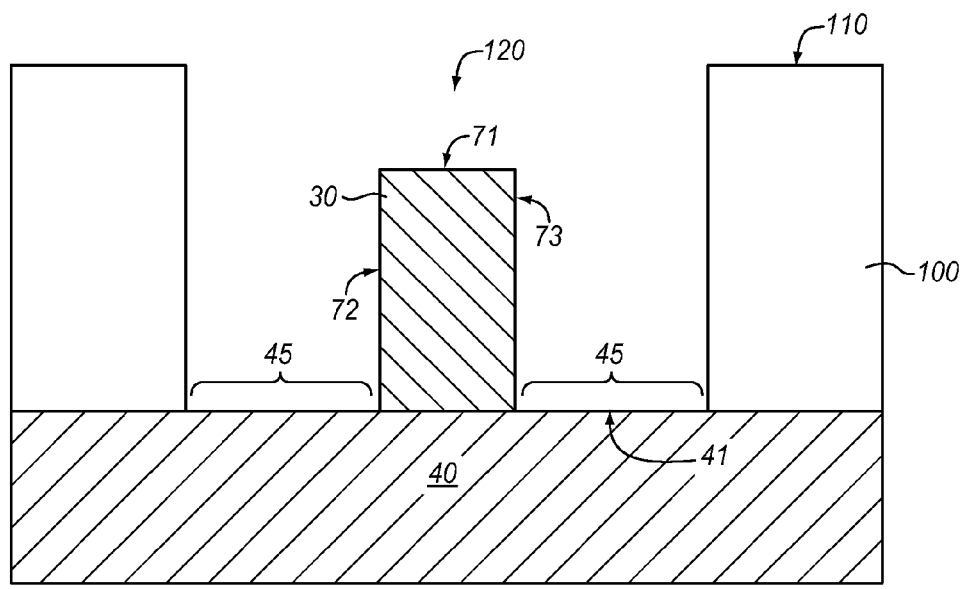

Next, in FIG. 4B, an opening 120 is formed in the interlayer dielectric 100 to expose the semiconductor body 30. In particular, the opening 120 exposes the top surface 71 and the first and second sidewalls 72, 73 of the semiconductor body 30. The opening 120 also exposes portions 45 of top surface 41 around the semiconductor body 30. Opening 120 can be formed by well known photolithography and etching techniques. The etching process uses an etchant chemistry that selectively etches the interlayer dielectric 100 but does not etch the semiconductor body 30 and substrate 40. The opening 120 does not expose the gate electrode (not shown).

The top surface 71 and the first and second sidewalls 72, 73 of the semiconductor body 30 may be treated with one or more nucleation promoting substances prior to forming a platinum zinc layer. The nucleation process may help the platinum zinc layer to adhere to the body, depending on the particular materials used. The nucleation promoting substances can be an organic substance, such as but not limited to self-assembled monolayers of substituted aryl groups (e.g. aminophenyl, bromophenyl, phenoxy), and alkyl chains terminated with functional groups such as amino, imino, hydroxyl, carboxylic acid, cyanate, isocyanate, halogen, thiol, vinyl or alkenyl groups. Furthermore, the nucleation promoting substance can also be an inorganic substance, such as but not limited to ammonium sulfide $(NH_4)_2S$, ammonium hydroxide ($NH_4OH$), tetramethylammonium hydroxide [$(CH_3)_4NOH$], phosphorus pentabromide ($PBr_5$), bromine ($Br_2$), phosphorus pentachloride ($PCl_5$), chlorine ($Cl_2$), hydrogen peroxide ($H_2O_2$), piranha solution, ozone ($O_3$), nickel(0) organometallic complexes, palladium(0) organometallic complexes, and platinum(0) organometallic complexes.

A plasma treatment can also be performed on the semiconductor body 30 prior to forming the platinum zinc layer. The plasma treatment is performed to improve the nucleation and surface adhesion of the platinum zinc layer on the top surface 71 and the first and second sidewalls 72, 73 of the semiconductor body 30. The plasma treatment uses a gas source, such as but not limited to helium, argon, xenon, oxygen, nitrogen, hydrogen, hydrogen bromide, chlorine, tetrafluoromethane, trifluoromethane, difluoromethane, octafluorocyclobutane, sulfur hexafluoride, hydrogen sulfide, ammonia or a combination of these gases. The plasma treatment can be performed in combination with the nucleation promoting treatment.

Figure 4C:
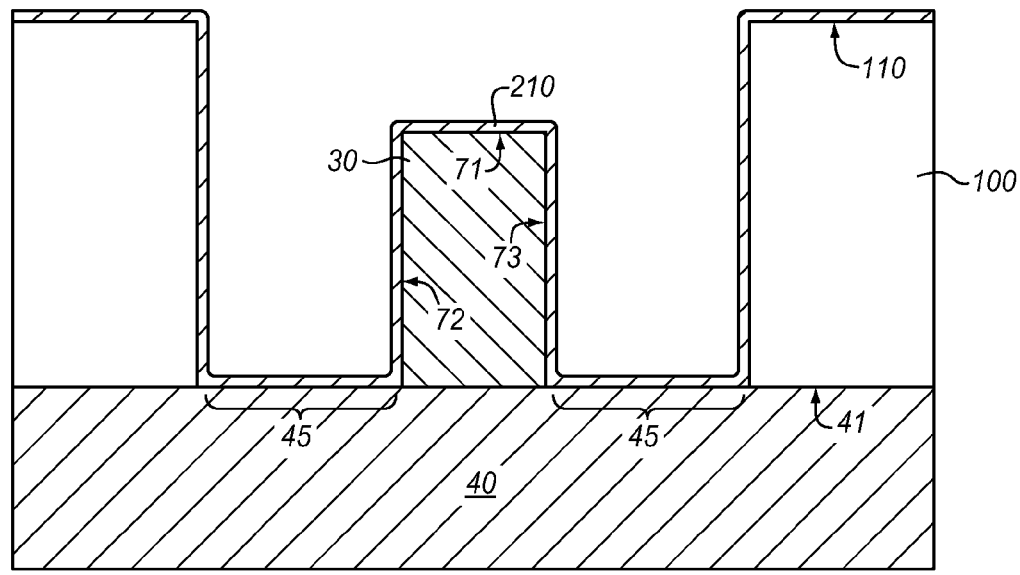

In FIG. 4C, the substrate 40 is placed in a reaction chamber to fabricate the PtZn layer. In one example, the reaction chamber is maintained at a substantially constant pressure having a range of about 0.1 to 10.0 Torr during deposition of the platinum zinc layer. The substrate 40 can be supported or secured on a support in the reaction chamber that is able to heat the substrate. In one example, the substrate 40 is heated to a constant temperature having a range of about 90-150 C during the deposition of the platinum zinc layer, and ideally about 125 C.

Next, the platinum zinc layer 210 is formed on the semiconductor body 30 as shown in FIG. 4C, for example by an atomic layer deposition (ALD) process. In this ALD process, the substrate 40 is alternately exposed to a platinum-containing precursor and a zinc-containing co-reactant for example at a constant low temperature having a range of about 60-150 C and preferably about 90-150 C.

The ALD process for fabricating the platinum zinc layer begins by exposing the entire substrate 40, including the semiconductor body 30, to the platinum-containing precursor. The precursor can be stored in a precursor source chamber, which is connected to the reaction chamber that houses the substrate. The precursor can be partially vaporized from the solid or liquid state to the desired temperature, e.g. 70-85 C in the source chamber. From the source chamber, the precursor can be delivered or released in a gas or a vapor form into the reaction chamber in an amount sufficient to allow the precursor to react with the substrate 40. The exposure can be for a time duration of about 0.1 to 10.0 seconds. However, the particular parameters of temperature, time and pressure, among others, may be adapted to suit any particular implementation.

After exposing the substrate 40 to the precursor, a purging process can be performed to remove the precursor and other by-products from the reaction chamber before exposing the substrate to the zinc containing co-reactant. In one example, the purging process injects an inert gas, such as but not limited to dinitrogen (N2), helium (He) or argon (Ar), to remove any unreacted precursor and by-products from the reaction chamber. The purging process can be performed for a time duration of about 1.0 to 10.0 seconds.

Next, the substrate and semiconductor body, is exposed to the co-reactant. The co-reactant reacts with the reacted deposited precursors to form the platinum zinc layer 210 described above. As shown in FIG. 4C, the deposited platinum zinc layer 210 is conformal to or conforms to the top surface 71 and the first and second sidewalls 72, 73 of the semiconductor body 30.

The co-reactant can be stored in a second co-reactant source chamber, which is connected to the reaction chamber. The co-reactant may also be held in a gas or vapor form in the second source chamber. The temperature of the second source chamber may be maintained at about the same temperature of the precursor source chamber, depending upon the particular materials used for the co-reactant. From the second source chamber, the co-reactant may be delivered or released as a gas or vapor form into the reaction chamber for a time duration of about 0.1 to 10.0 seconds in an amount sufficient to react with the reacted precursors deposited on the substrate and body.

After the co-reactant exposure, another purging process can be performed to remove the co-reactant and other by-products from the reaction chamber before again exposing the substrate 40 to the precursor. The purging process may be the same as or similar to that described above to purge the precursor. As a result a thin atomic layer 210 of platinum and zinc is deposited layer over the entire exposed structure as shown.

Figure 4D:
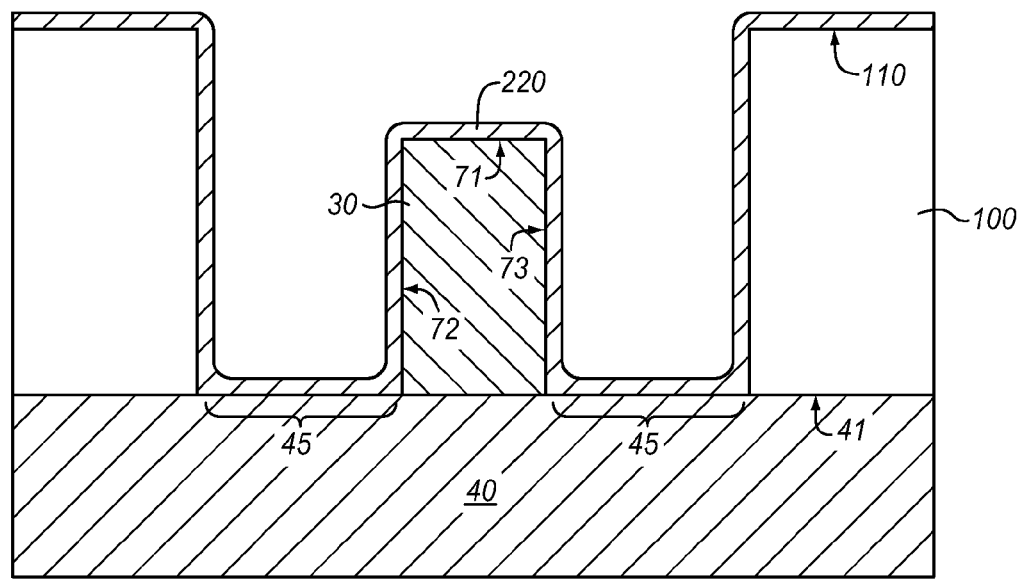

The ALD cycle can be repeated until a platinum zinc layer of a desired thickness is formed on the semiconductor body 30. The semiconductor body is alternately exposed to the precursor and the co-reactant to form a thicker platinum zinc layer 220 as shown in FIG. 4D. From about 50 to about 1000 ALD cycles may be performed to fabricate the platinum zinc layer 220 to a thickness of from about 50 to about 1000 Angstroms on the semiconductor body 30. The completed platinum zinc layer 220 may serve as a contact layer for the source or drain region 31 of the semiconductor body 30. In alternative embodiments it may serve as a contact for other devices, a conductive trace, or a shield or barrier for electrical or process purposes.

Figure 4E:
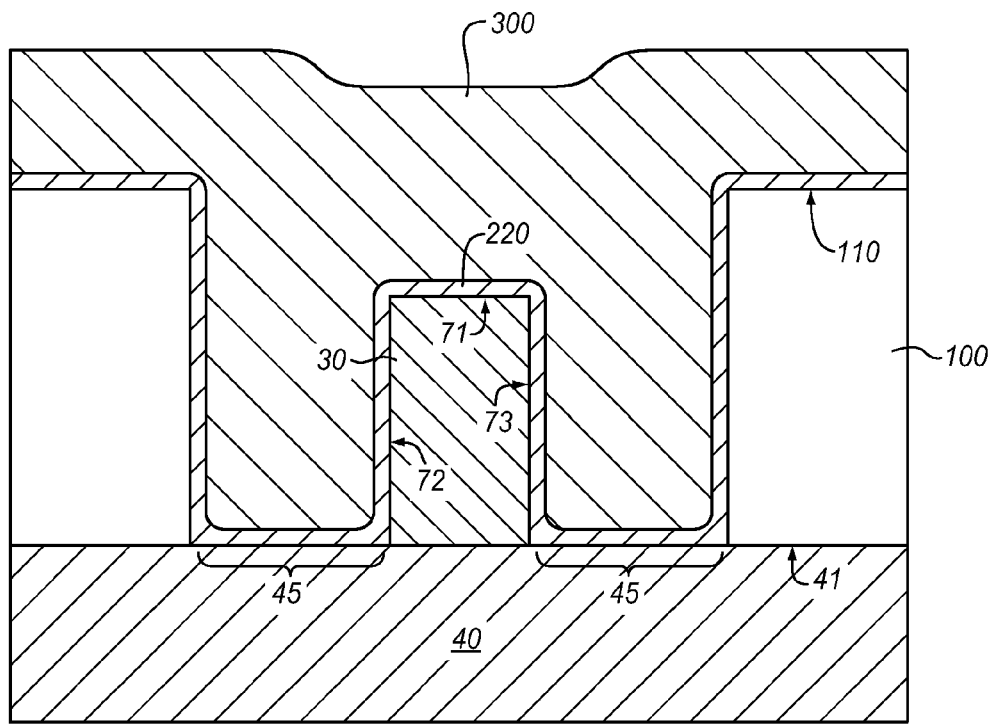

The ALD process for the PtZn layers gives a very controlled thin film deposition on a number of substrates and, by its nature, is highly uniform and conformal over three-dimensional structures thus circumventing the limitations of current PVD contact metal deposition processes After the ALD process is complete, a metal layer 400 can be formed onto the platinum zinc layer 220. In one example, the metal layer is formed by blanket depositing a metal film 300 onto the entire platinum zinc layer 220 as shown in FIG. 4E. The metal layer film 300 can be made of tungsten, titanium and other suitable metals. Metal film can be deposited by well known techniques, such as but not limited to chemical vapor deposition, physical vapor deposition and electroless deposition.

Figure 4F:
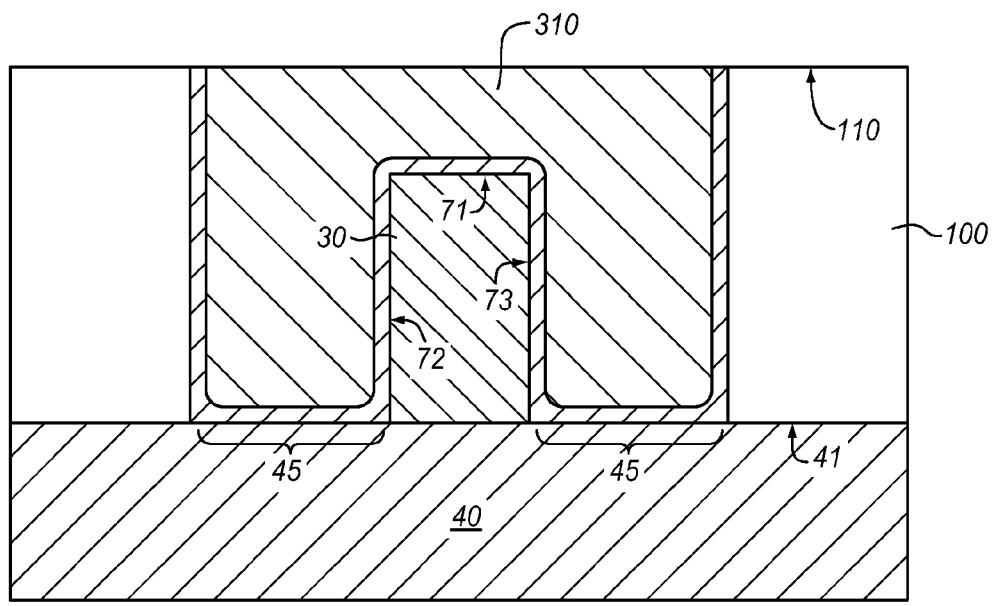

Next, in FIG. 4F, the metal film 300 is planarized to form a metal layer 310 with a top surface that is planar to the top surface 110 of the interlayer dielectric 100. The metal film 300 can be planarized by well known techniques, such as but not limited to chemical-mechanical polishing (CMP).

As shown in FIGS. 4A-4F, the platinum zinc layer described herein can be used as a low-temperature non-reactive contact or gate metal. The ALD PtZn film is deposited through a contact trench in isolation oxide. The trench is then filled with fill metals. This process will thus leave metal over the isolation oxide. The metal is then removed by a CMP step. The advantages of this type of contact over, for example a silicided contact are that there is virtually no consumption of the semiconductor substrate or body. This may be critical in 3D architectures where the volume of semiconductor is limited. In addition, such a contact can be formed on other types of materials, for example, non-Si semiconductor materials. Dielectric/semiconductor sandwiched between contact metal and underlying semiconductor substrate can also be formed as well as work function metals in PMOS metal gates.

Although the ALD process describes the formation of a platinum zinc contact layer for a FinFET transistor in FIGS. 4A-4F, it can be appreciated that the ALD process is not limited to such an application and device but can also be applied in other devices, such as but not limited to bipolar junction transistors (BJTs) and planar metal-oxide-semiconductor field effect transistors (MOSFETs).

Figure 5A:
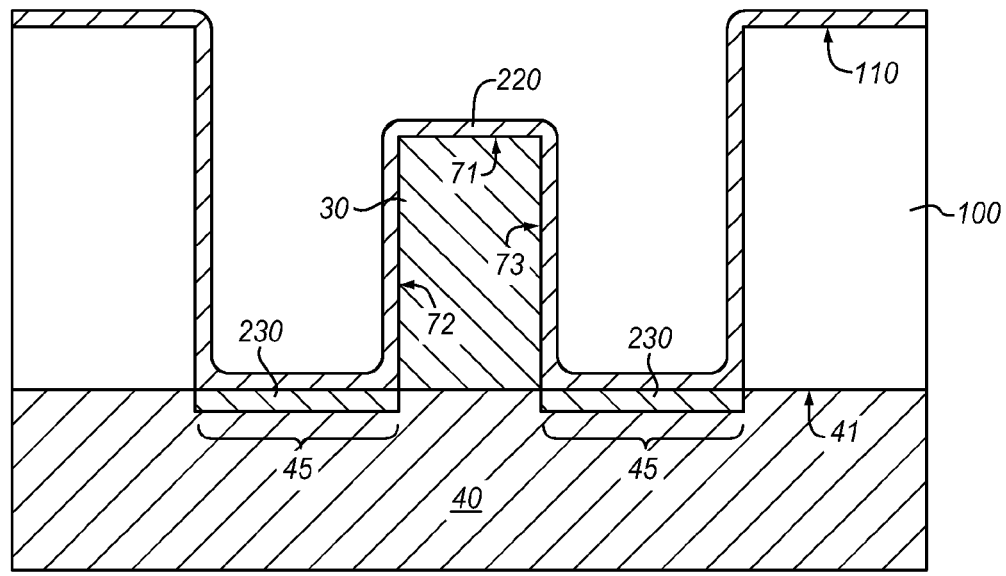
FIGS. 5A to 5D are cross-sectional views of forming another conformal platinum-zinc layer on another semiconductor device according to another embodiment of the invention.

As an alternative, a silicided contact may be formed. FIG. 5A shows a structure similar to that of FIG. 4D. The platinum zinc layer 220 has been formed over the ILD 100, the substrate 40, and the semiconductor body 30. A heat treatment has then been performed to react the metal with the substrate. One such heat treatment is an RTA (Rapid Thermal Annealing), applied to the deposited film, however, other thermal treatments may be used, depending on the particular implementation. The thermal treatment creates a silicide layer 230 at the bottom 45 of each contact trench.

Figure 5B:
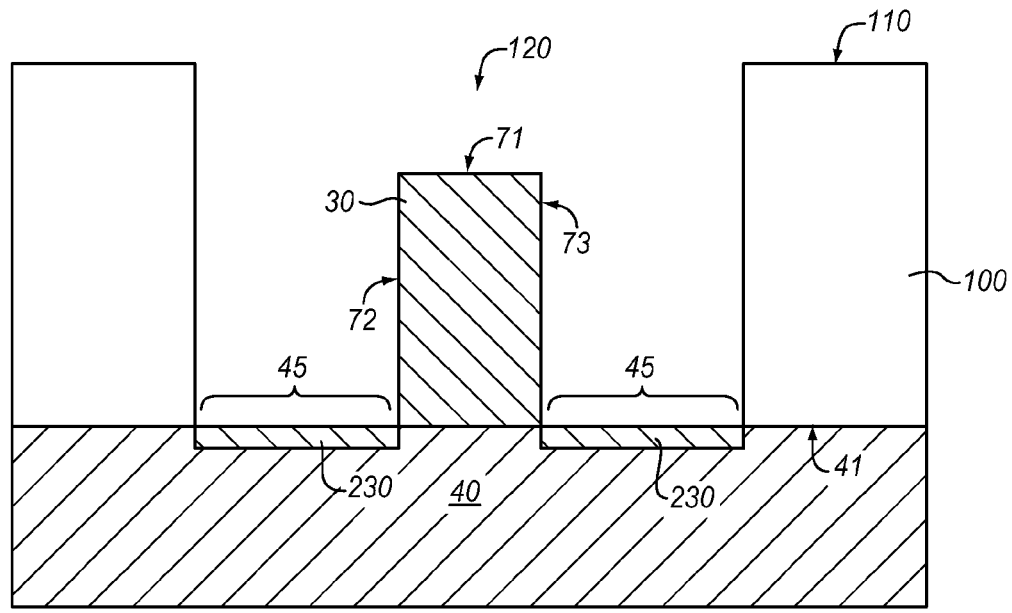

A standard metal etch clean as described above may then be applied to the substrate to remove all of the unreacted ALD deposited PtZn layer. This leaves the silicide exposed at the bottom of the contact trench as shown in FIG. 5B. A room temperature standard metal etch clean, for example using a mixture of sulfuric acid and hydrogen peroxide, may be used to essentially remove the PtZn film. This clean will be effective after annealing the film on the silicide area to leave the layers of conductive surface silicide 230.

Figure 5C:
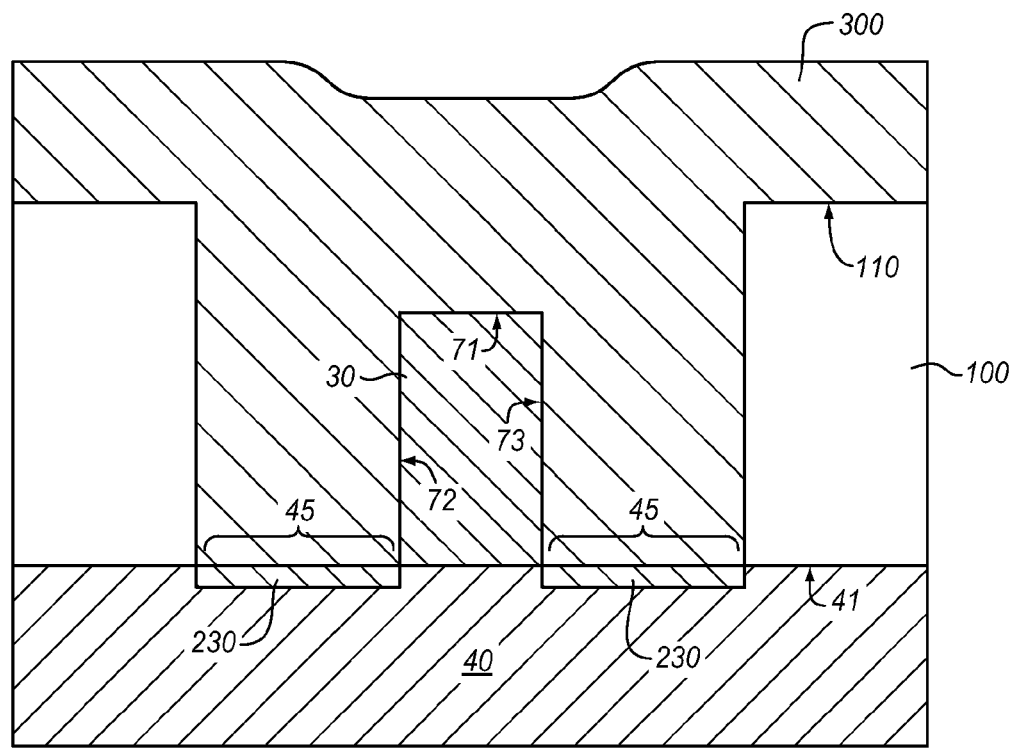
Figure 5D:
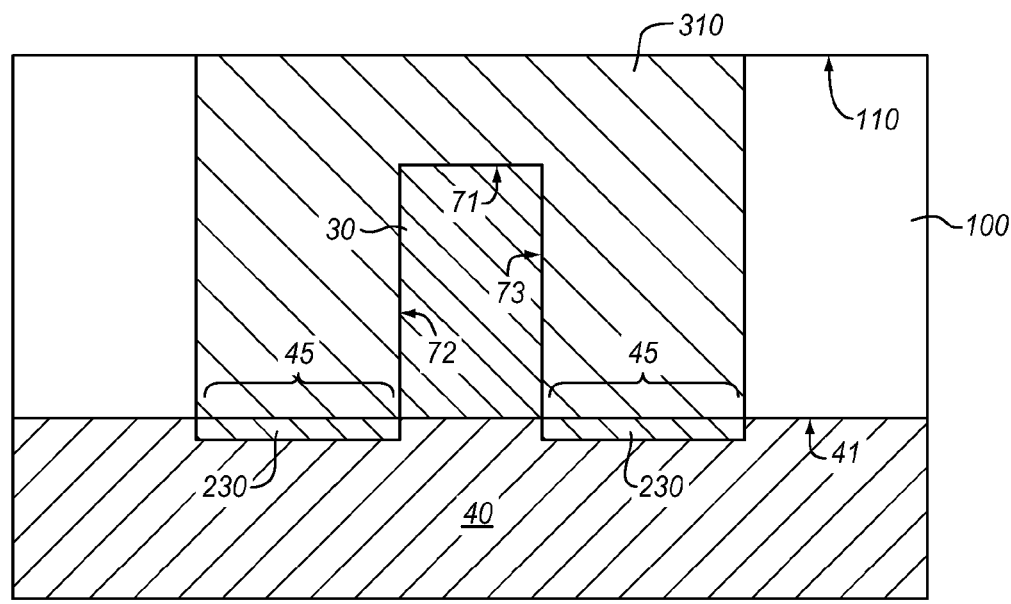

After the silicide generation process is complete, a metal layer 300 can be formed, for example, by blanket depositing the metal film 300 onto the entire structure including the silicide areas as shown in FIG. 5C. Finally, as shown in FIG. 5D, the metal film 300 is planarized to form a metal layer 310 with a top surface that is planar to the top surface 110 of the interlayer dielectric 100 by, for example, CMP.

This process and variations to it enable integration of the contact either as a blanket film on the entire device (subtractive metallization) or through a contact trench in isolation oxide (self-aligned contacts). In the illustrated example, the film deposited on the isolation oxide is removed by a standard metal etch clean, however other types of cleaning processes may be used. As a result, the only metal left behind is the silicide at the bottom of the contact trench.

A variety of other modifications and alternative structures can be constructed using a PtZn layer described herein. In one example, the interlayer dielectric is patterned to form an opening that partially exposes the semiconductor body. In contrast with FIG. 4B, the opening does not expose portions of the substrate adjacent to the semiconductor body, but only the top surface and portions of the first and second sidewalls.

The Schottky Barrier Height (SBH) of a PtZn film as described herein is significantly p-shifted with respect to mid-gap Ni. When in direct contact with n-type Si, the highly p-type nature of the film provides benefits for PMOS contact and gate applications.

The terms "conformal" and "conformally" are used herein to describe a film or layer having a relatively uniform thickness on a substrate, and having the capability to follow the shape of the substrate and any features thereon. The ALD deposited PtZn film shows much better conformality than PVD.

In the following description, numerous specific details are set forth in order to provide a thorough understanding of the present invention. In other instances, well known semiconductor processing techniques and features have not been described in particular detail in order not to unnecessarily obscure the present invention.

Several embodiments of the invention have thus been described. However, those ordinarily skilled in the art will recognize that the invention is not limited to the embodiments described, but can be practiced with modification and alteration within the spirit and scope of the appended claims that follow.

What is claimed is:

1. A method of forming a semiconductor device comprising:
   heating a substrate in a reaction chamber;
   exposing a region of the substrate to a precursor that contains platinum;
   purging excess precursor from the chamber;
   exposing the region of the substrate to a co-reactant containing zinc to cause a reaction between the precursor and the co-reactant to form a platinum zinc film on the region; and
   purging the chamber of excess reaction by-products.

2. The method of claim 1, further comprising repeating exposing a region of the substrate to the precursor and exposing the region of the substrate to the co-reactant in an alternating manner.

3. The method of claim 2, further comprising:
   purging the precursor from the chamber before exposing the region of the substrate to the co-reactant; and
   purging the co-reactant from the chamber before exposing the region of the substrate to the precursor.

4. The method of claim 1, further comprising annealing the platinum zinc film to cause a reaction with the region of the substrate.

5. The method of claim 1, wherein the platinum is a platinum (II) compound.

6. The method of claim 1, wherein the precursor is made of a dialkyl (bis alkene) platinum (II) compound.

7. The method of claim 1, wherein the co-reactant is made of an organozinc compound.

8. The method of claim 1, wherein the region of the substrate is made of a material selected from the group consisting of silicon, germanium silicon, germanium, and semiconductor compounds including III-V materials.

9. The method of claim 1, wherein the substrate is made of an insulating material selected from the group consisting of dielectrics, oxides, and metal oxides.

10. The method of claim 1, further comprising exposing the region of the substrate to nucleation promoting substances before exposing the region to the precursor.

11. The method of claim 1, wherein the substrate includes:
    a source region formed thereon;
    a drain region formed thereon; and
    a channel region formed thereon between the source and drain regions,
    wherein the source and drain regions each includes a top surface, and sidewalls extending from the top surface to the substrate, and
    wherein the reaction conformally deposits the platinum zinc film on the top surface and sidewalls.

12. The method of claim 11, further comprising forming a gate electrode around the channel region of the substrate.

13. The method of claim 11 further comprising repeatedly alternately exposing the substrate to the precursor and the co-reactant.

14. The method of claim 11, further comprising reactively annealing the platinum zinc film film with the substrate to form a silicide layer in the substrate.

15. A semiconductor device, comprising:
    a substrate having a gate electrode formed thereon;
    a source region and a drain region formed on the substrate, wherein the source and drain regions are formed on opposite sides of the gate electrode;
    a first platinum zinc layer formed on the source and the drain regions by:
    heating the substrate in a reaction chamber;
    exposing the source and drain regions to a precursor that contains platinum;
    purging excess precursor from the chamber;
    exposing the source and drain regions of the substrate to a co-reactant containing zinc to cause a reaction between the precursor and the co-reactant to form a platinum zinc film on the region; and
    purging the chamber of excess reaction by-products.

16. The semiconductor device of claim 15, further comprising
    an interlayer dielectric formed on the substrate and the source and drain regions, the interlayer dielectric having
    a first opening extending from the top surface of interlayer dielectric to the source region; and
    a second opening extending from the top surface of interlayer dielectric to the drain region 17. The semiconductor of claim 15, wherein the platinum zinc layer is conformally deposited on the top surface and the sidewalls of the source and drain regions.

* * * * *

UNITED STATES PATENT AND TRADEMARK OFFICE
CERTIFICATE OF CORRECTION

PATENT NO. : 8,440,556 B2  
APPLICATION NO. : 12/975786  
DATED : May 14, 2013  
INVENTOR(S) : Clendenning et al.

Page 1 of 1

It is certified that error appears in the above-identified patent and that said Letters Patent is hereby corrected as shown below:

In the Claims:

In column 8, at line 36 delete, "the platinum zinc film film" and insert --the film--.

Signed and Sealed this
Twenty-fourth Day of September, 2013

Teresa Stanek Rea
*Deputy Director of the United States Patent and Trademark Office*